United States Patent [19]
Schiemenz, Jr. et al.

[11] Patent Number: 5,834,972
[45] Date of Patent: Nov. 10, 1998

[54] METHOD AND SYSTEM IN A HYBRID MATRIX AMPLIFIER FOR CONFIGURING A DIGITAL TRANSFORMER

[75] Inventors: Arthur Fred Schiemenz, Jr., Fort Worth; Yuda Yehuda Luz, Euless; Dale Robert Anderson; Louay Adel Jalloul, both of Fort Worth, all of Tex.

[73] Assignee: Motorola, Inc., Schaumburg, Ill.

[21] Appl. No.: 728,717

[22] Filed: Oct. 11, 1996

[51] Int. Cl.⁶ .................................................... H03F 3/68
[52] U.S. Cl. ................................ 330/124 R; 330/124 D; 330/286; 330/295
[58] Field of Search ................................. 330/53, 124 R, 330/124 D, 147, 148, 286, 287, 295

[56] References Cited

U.S. PATENT DOCUMENTS

5,574,967  11/1996  Dent et al. .............................. 455/12.1
5,675,285  10/1997  Winters ................................. 330/124 R

Primary Examiner—James B. Mullins
Attorney, Agent, or Firm—Bruce Terry

[57] ABSTRACT

In a hybrid matrix amplifier array (100), a configurable digital transform matrix (116) is initialize with a matrix of transform coefficients. A plurality of digital input signals ($M_1$–$M_4$) are received at inputs of the configurable digital transform matrix (116). The plurality of digital input signals are transformed to produce a plurality of transform digital signals ($A_1$–$A_4$) using the matrix of transform coefficients. The plurality of transform digital signals are converted to a plurality of transformed analoged signals (206) to produce a plurality of transformed analog signals. The transformed analog signals are amplified (104, 208) to produce amplified transformed signals. Finally, the amplified transformed signals are inverse transformed (102, 210) to produce output signals that correspond to a respective digital input signal ($M_1$–$M_4$). Upon sensing a failure in an amplifier array (104, 126) a controller (128) recalls matrix transform coefficients from a memory (130) and write and reconfigures the digital transform matrix (116) to minimize the effects of the amplifier failure at the hybrid matrix amplifier outputs (132).

21 Claims, 6 Drawing Sheets

METHOD AND SYSTEM IN A HYBRID MATRIX AMPLIFIER FOR CONFIGURING A DIGITAL TRANSFORMER

FIELD OF THE INVENTION

The present invention is related in general to signal amplification, and more particularly to an improved method and system having a configurable digital transformer in a hybrid matrix amplifier array.

BACKGROUND OF THE INVENTION

Figure 1:
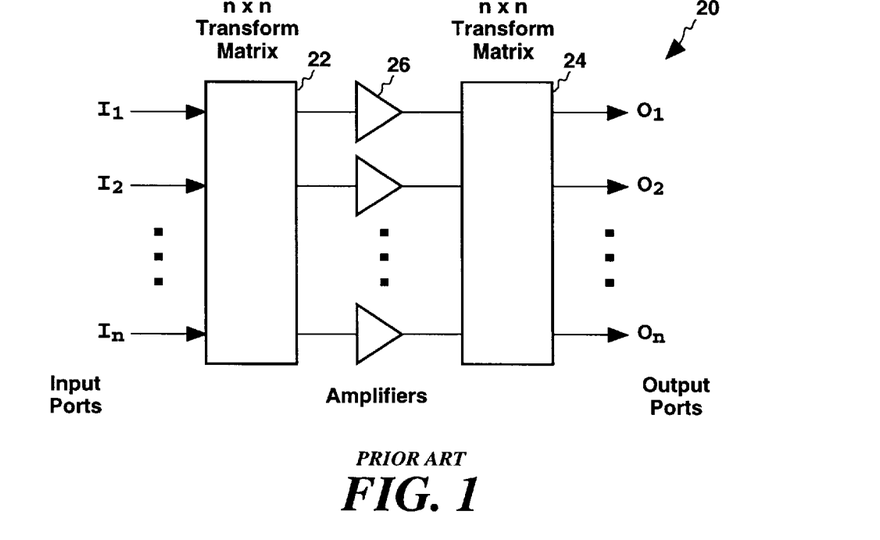
FIG. 1 is a high-level depiction of a prior art hybrid matrix amplifier.

A hybrid matrix amplifier is a parallel set of amplifiers, each having inputs fed, and outputs combined, with multi-port matrices made up of hybrid couplers. The general configuration of a hybrid matrix amplifier 20 is shown in FIG. 1. Hybrid matrices 22 and 24 connected in the manner shown create information paths—extending from $I_n$ to $O_n$—which are separate at the input ports $I_n$ and output ports $O_n$. Between hybrid matrices 22 and 24 amplifier array 26 is used to amplify signals. These signals between the matrices are distributed evenly in amplitude, and have a specific phase relationship according to which input port $I_n$ the signal entered. When amplifier array 26 is configured between matrices 22 and 24, all amplifiers in amplifier array 26 share the amplification of the signal on the path $I_1$ to $O_1$, as well as signals on all other n–1 paths.

Figure 2:
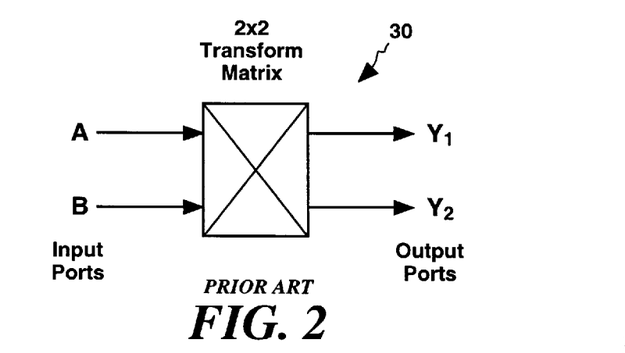
FIG. 2 is a schematic representation of a prior art coupler used in a transform matrix.

A basic building block of many transform matrices is a 90° hybrid- or 3 dB coupler, which is shown schematically in FIG. 2 as coupler 30. Coupler 30 has four ports: two input ports, A and B, and two output ports, $Y_1$ and $Y_2$. Coupler 30 is typically linear and reciprocal. Because of the reciprocal nature of coupler 30, input ports A and B can be interchanged with output ports $Y_1$ and $Y_2$. The coupler also has a given characteristic bandpass and characteristic impedances at the ports.

In operation, if signal A is received at input port A of coupler 30, the power or energy of the signal is split into two equal quantities, with one quantity fed to output port $Y_1$ and the other fed to output port $Y_2$. The signal phase of the power transmitted from output port $Y_2$ is delayed by 90 electrical degrees, or one-quarter of an operating wavelength, from the signal phase of the power transmitted from output port $Y_1$. Similarly, if the power of signal B is received at input port B, the power of the signal is split into two equal quantities, with half of the power fed to output port $Y_1$ and the other half fed to output port $Y_2$. And the signal phase of the power from signal B transmitted from output port $Y_1$ is delayed by 90 electrical degrees, or one-quarter of an operating wavelength, from the signal phase of the power transmitted from output port $Y_2$.

Thus, if signal A is applied to input port A, and signal B applied to input port B, signals appearing at output ports $Y_1$ and $Y_2$ are represented by the equations below.

$$Y_1 = \frac{A}{\sqrt{2}} \angle -90° + \frac{B}{\sqrt{2}} \angle -180°$$

$$Y_2 = \frac{A}{\sqrt{2}} \angle -180° + \frac{B}{\sqrt{2}} \angle -90°$$

$$\frac{1}{\sqrt{2}} \begin{bmatrix} -j & -1 \\ -1 & -j \end{bmatrix} \begin{bmatrix} A \\ B \end{bmatrix} = \begin{bmatrix} Y_1 \\ Y_2 \end{bmatrix} \quad j \text{ is } 1 \angle 90° = sqrt(-1)$$

As shown by the above equations, if signal power is simultaneously applied to input ports A and B, signal superposition occurs because the coupler is linear.

In summary, any power received at an input port is divided equally between the output ports of the coupler, and signals transmitted by the output ports have specific phase relationships.

Figure 3:
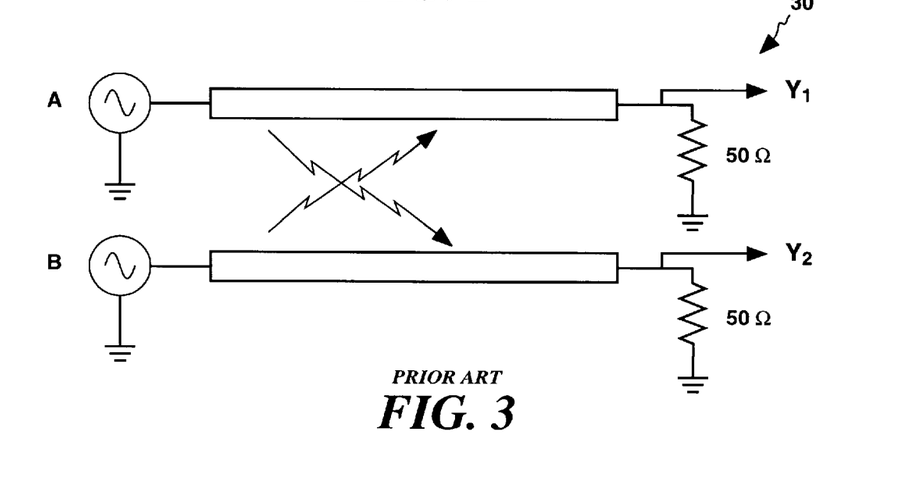
FIG. 3 is a high-level pictorial representation of the prior art coupler in FIG. 2.

In the prior art, coupler 30 is typically constructed using shielded (double ground plane) striplines or microstriplines. This stripline coupling technique is schematically represented in FIG. 3 and described in U.S. Pat. No. 3,731,217 to Gerst et al. (1973), which is incorporated herein by reference.

Figure 4:
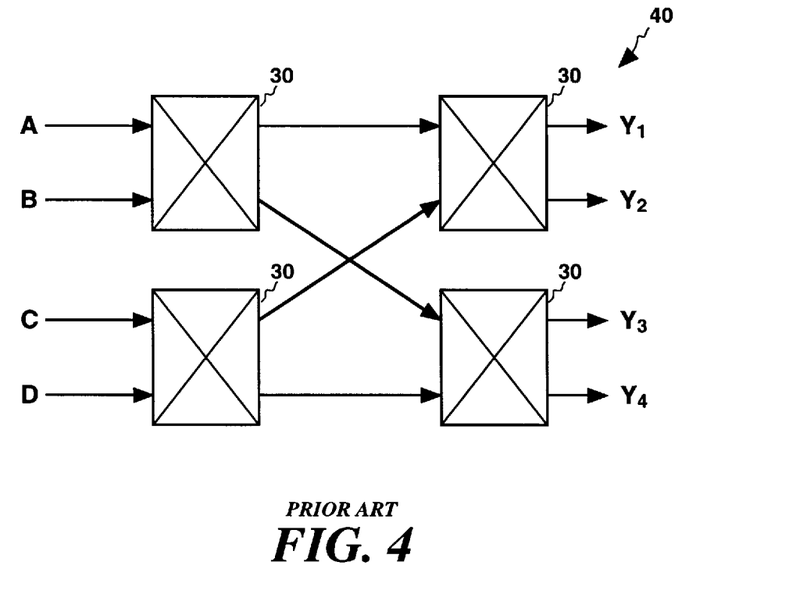
FIG. 4 is a high-level schematic representation of a prior art Fourier transform matrix.

With reference now to FIG. 4, a 4×4 Fourier transform matrix is illustrated. Fourier transform matrix 40, which has four inputs and four outputs, uses four 3 dB couplers 30 connected as shown.

Figure 5:
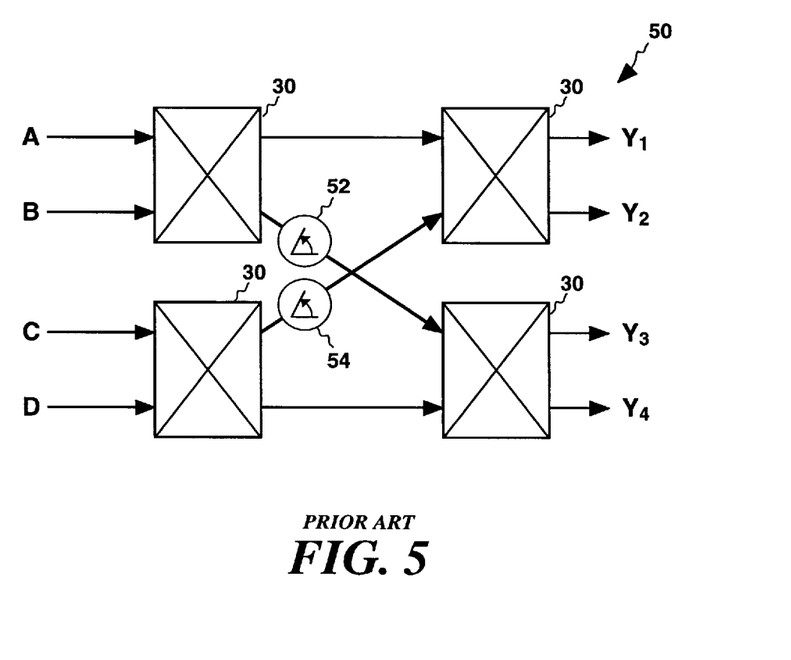
FIG. 5 is a high-level block diagram of a prior art Butler transform matrix.

FIG. 5 shows a different 4×4 transform matrix known as a Butler type transform matrix. Butler transform matrix 50 is essentially the Fourier transform matrix 40 with the addition of phase shifters 52 and 54. If phase shifters 52 and 54 are 45° phase shifters, Butler transform matrix 50 is referred to as a 45° Butler transform matrix.

Problems with hybrid matrix amplifier 20 include the high costs of two transform matrices, multiple radio frequency connections which have lower reliability and high manufacturing costs, space required by two transform matrices, and the additional weight of two transform matrices.

Therefore, a need exists for a method and system in a hybrid matrix amplifier for reducing transform matrix costs, decreasing the number of radio frequency connections, and decreasing space and weight required by transform matrices.

BRIEF DESCRIPTION OF THE DRAWINGS

The novel features believed characteristic of the invention are set forth in the appended claims. The invention itself, however, as well as a preferred mode of use, further objects, and advantages thereof, will best be understood by reference to the following detailed description of an illustrative embodiment when read in conjunction with the accompanying drawings, wherein:

DETAILED DESCRIPTION OF THE INVENTION

Figure 6:
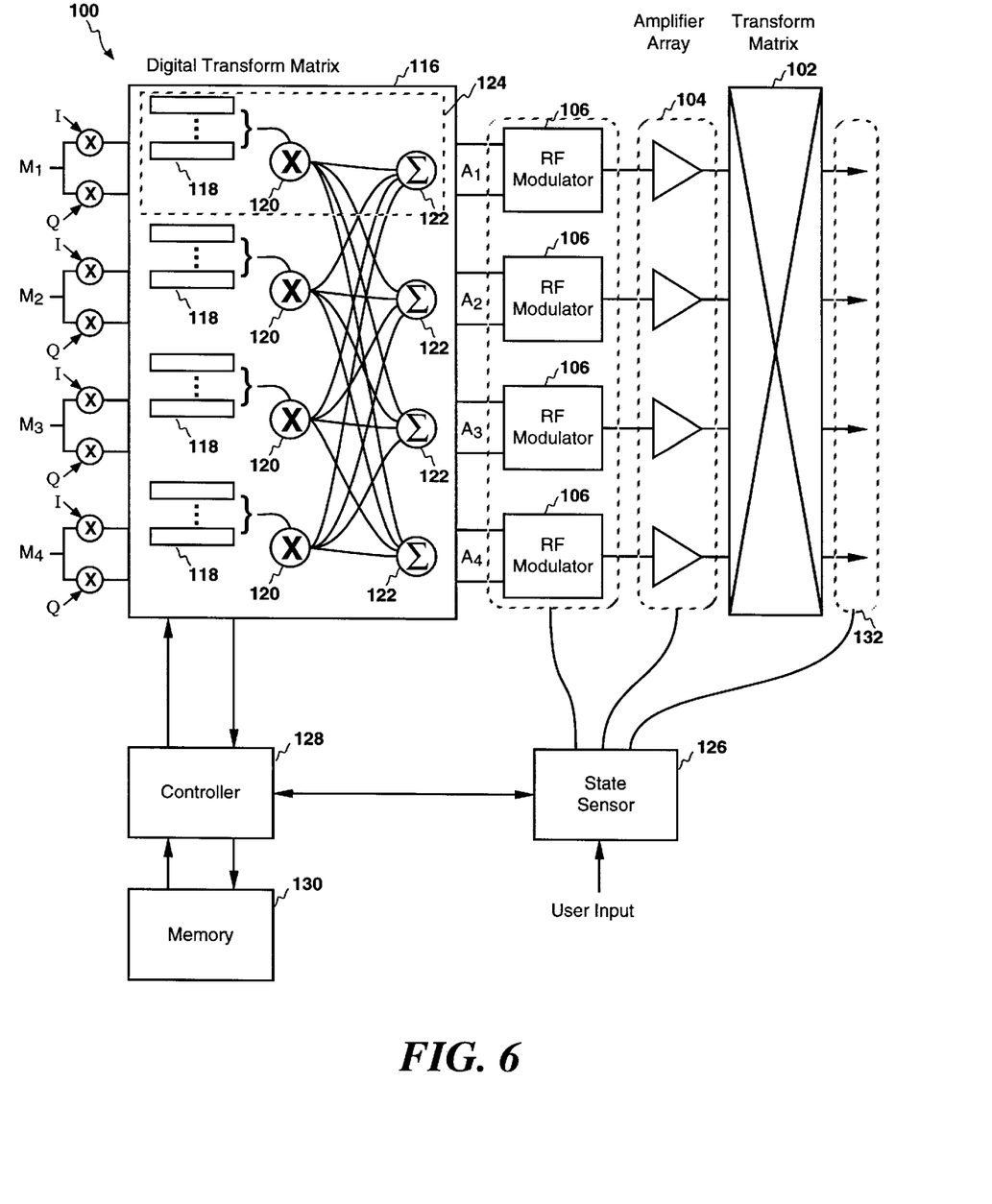
FIG. 6 is a block diagram of a hybrid matrix amplifier having a configurable digital transform matrix in accordance with the method and system of the present invention.

With reference now to the figures, and in particular with reference to FIG. 6, there is depicted a block diagram of a hybrid matrix amplifier having a configurable digital transform matrix and an RF modulator in accordance with the method and system of the present invention. As illustrated, hybrid matrix amplifier 100 includes transform matrix 102 having inputs coupled to outputs of amplifier array 104. Because transform matrix 102 is coupled to amplifier array 104, which outputs amplified transformed signals, transform matrix 102 performs an inverse transform function which separates the components of the amplified transformed signals into discrete outputs that correspond to one of the inputs of the hybrid matrix amplifier.

In the embodiment shown in FIG. 6, transform matrix 102 is a 4×4 transform matrix having 4 inputs and 4 outputs. However, transform matrix 102 may be any size larger than a 2×2 matrix, depending upon design requirements. Thus, transform matrix 102 may be an m x n transform matrix.

Transform matrix 102 may be implemented with different types of matrices. For example, transform matrix 102 may be implemented with either a Fourier transform matrix or a Butler transform matrix. Additionally, other transform matrices that distribute signal power from one input to multiple outputs in predetermined phased relationships may be used. As an example, transform matrix 102 may be implemented by a transform matrix sold under part number "580014" by Anaren Microwave, Inc., in East Syracuse, N.Y. 13057.

Amplifiers in amplifier array 104 receive a low level radio frequency signal, and amplify such a signal to produce a high level output signal which should substantially match the input signal. Amplifier array 104 may be implemented with amplifiers sold under part number "MHW927B" by Motorola, Inc., of Shaumburg, Ill. 60196. For best performance, amplifiers in amplifier array 104 should be matched in both gain and phase delay.

Inputs to amplifier array 104 are coupled to outputs of radio frequency (RF) modulators 106. Radio frequency modulated signals produced by RF modulators 106 may include signals modulated according to a code division multiple access (CDMA) modulation scheme as described in a specification entitled Wideband Spread Spectrum Cellular System standard EIA/TIA/IS-95. This modulated radio frequency signal may also be in the form of phase shift keying (PSK) or amplitude phase keying, such as quadature amplitude modulation (QAM). Modulation according to other air interface standards may also be used. Examples of other air interfaces include Advanced Mobile Phone Serve (AMPS) according to the EIA-553 standard, Time Division Multiple Access (TDMA) according to IS-54, Narrowband AMPS (NAMPS) according to IS-89, and the air interface used in Global System for Mobile Communication (GSM).

Figure 7:
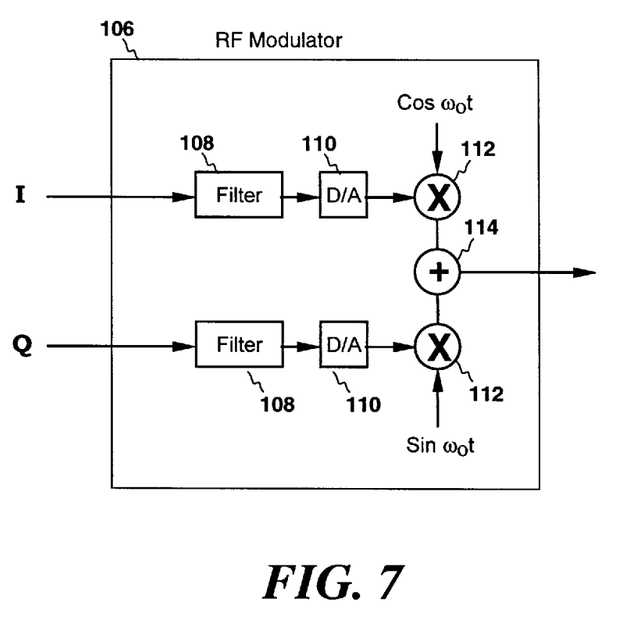
FIG. 7 is a high-level schematic representation of radio frequency digital modulator shown in FIG. 6 in accordance with the method and system of the present invention.

With reference now to FIG. 7, there is depicted a more detailed high high-level level schematic representation of the radio frequency digital modulator shown in FIG. 6 in accordance with the method and system of the present invention. As illustrated, a complex digital signal is received at the I and Q inputs. These inputs are then filtered by bandpass filters 108.

Filters 108 smoothes the edges of a digital signal to minimized rapid signal transitions which could result in radio frequency emissions outside the allocated bandwidth.

After filtering, digital to analog (D/A) converters 110 convert the digital signal to an analog signal. Analog signals from D/A converters 110 are mixed with sinusoidal signals at modulator 112. Next, the I and Q portions of the signal are combined at summer 114 to produce a radio frequency output signal modulated by digital I and Q signals.

Referring again to FIG. 6, RF modulators 106 receive data from I and Q bit channels, which are output by digital transform matrix 116 and referenced as $A_1$–$A_4$. At the input of digital transform matrix 116, message signals, $M_1$–$M_4$, are received in I and Q format.

In the example shown in FIG. 6, digital transform matrix 116 is a 4×4 transform matrix, having 4 complex digital inputs and 4 complex digital outputs. Signals received at the inputs to digital transform matrix 116 are mathematically multiplied, multiplexed, and recombined to digitally emulate a transform matrix function, such as the transform matrix function performed by transform matrix 22 in FIG. 1. However, according to an important aspect of this invention, transform matrix function is performed at baseband frequencies on digital signals using combinatorial logic rather than being performed on analog signals at radio frequency using electromagnetic techniques provided by stripline couplers.

As shown schematically in FIG. 6, digital transform matrix 116 includes registers 118 for storing transform parameters, or matrix transform coefficients. Message input signals $M_1$–$M_4$ are multiplied by such matrix transform coefficients in complex multiplier 120. Outputs of each complex multiplier 120 may be coupled to inputs of summer 122. Outputs of summer 122, in I and Q format, are passed to RF modulators 106. Thus, as shown schematically in FIG. 6, weighted portions of each input signal are combined at each output to provide a complex output signal that represents a portion of each input signal that has been adjusted or modified in both amplitude and phase. Mathematically, the function of digital transform matrix 116 is represented by the equation:

$$\begin{bmatrix} A_1 \\ A_2 \\ A_3 \\ A_4 \end{bmatrix} = \begin{bmatrix} B_{11} & B_{12} & B_{13} & B_{14} \\ B_{21} & B_{22} & B_{23} & B_{24} \\ B_{31} & B_{32} & B_{33} & B_{34} \\ B_{41} & B_{42} & B_{43} & B_{44} \end{bmatrix} \begin{bmatrix} M_1 \\ M_2 \\ M_3 \\ M_4 \end{bmatrix}$$

each element of the matrix is a complex constant, with M representing the complex message input vector, B representing the complex transform matrix coefficients, and A representing the complex output vector from digital transform matrix 116.

Within digital transform matrix 116, 4 complex multiplier circuits 124 are shown. These multiplier circuits are described in greater detail below with reference to FIG. 8.

Also shown in FIG. 6 are state sensor 126, controller 128, and memory 130. State sensor 126 may be coupled to various components in hybrid matrix amplifier 100, such as hybrid matrix amplifier outputs 132, amplifier array 104, and RF modulators 106. State sensor 126 senses conditions or states within hybrid matrix amplifier 100 and produces a signal that represents a state of the hybrid matrix amplifier. States of the hybrid matrix amplifier may include a degraded state in which, for example, one or more amplifiers in amplifier array 104 has failed. Other failure modes may be detected by sensing conditions at hybrid matrix amplifier outputs 132 or in RF modulators 106.

State sensor 126 may also be responsive to a user input, which may be in the form of configuration switches or an input from another data processing system. Such user input may be used to indicate that hybrid matrix amplifier 100 should be reconfigured to operate in an alternate mode. Such alternate modes may include, for examples, modes that operate a different number of sectors at the base station site.

State sensor 126 provides a signal that is coupled to controller 128. In response to receiving a state signal, controller 128 may reconfigure digital transform matrix 116 by recalling matrix transform coefficients from memory 130 and transferring or writing such matrix transform coefficients into registers 118 in digital transform matrix 116. By reloading registers 118 with an alternate group of matrix transform coefficients, the mathematical function of digital transform matrix 116 may be changed to provide additional features or compensate for a failure with, say, an amplifier in amplifier array 104.

fier array 104 may be sensed to determined if all amplifiers are operating normally.

Matrix 1

$$\begin{bmatrix} -.5 & 0+j.5 & .3535534+j.353554 & .3535534+j.353554 \\ 0+j.5 & .5 & .3535534+j.353554 & .3535534+j.353554 \\ .3535534+j.353554 & .3535534+j.353554 & .5 & 0+j.5 \\ .3535534+j.353554 & .3535534+j.353554 & 0+j.5 & -.5 \end{bmatrix}$$

Figure 8:
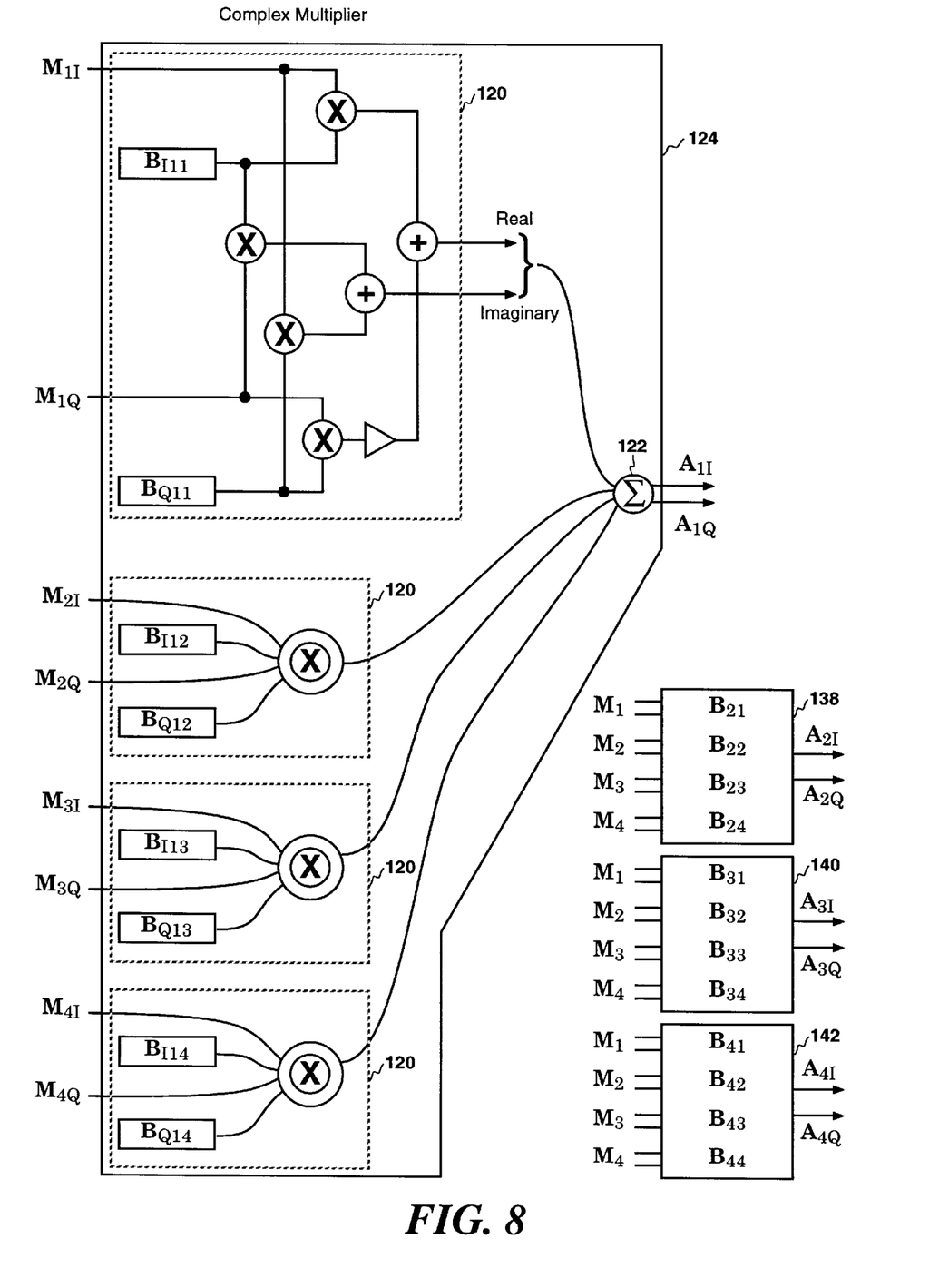
FIG. 8 is a high-level schematic representation of the complex multiplier shown in FIG. 6 in accordance with the method and system of the present invention.

With reference now to FIG. 8, there is depicted a complex multiplier used in digital transform matrix 116. As illustrated, I and Q components of digital message signals $M_1$ through $M_4$ are input to a multiplier circuit, such as multiplier 120. Multiplier 120 performs the operation described by the equation:

$$M \cdot B = (M_I B_I - M_Q B_Q) + j(M_I B_Q - M_Q B_I)$$

which is a complex multiplication operation.

Each block labeled with reference numeral 120 represents such a multiplication circuit. To produce outputs $A_{1I}$ and $A_{1Q}$ the outputs of all four such multiplication circuits are summed at summer 122. The signal $A_{1I}$ may be described by the equation:

$$A_{1I} = M_{1I}B_{11I} - M_{1Q}B_{11Q} + \\ M_{2I}B_{12I} - M_{2Q}B_{12Q} + \\ M_{3I}B_{13I} - M_{3Q}B_{13Q} + \\ M_{4I}B_{14I} - M_{4Q}B_{14Q}$$

The signal $A_{1Q}$ may be described by the equation:

$$A_{1Q} = M_{1I}B_{11Q} - M_{1Q}B_{11I} + \\ M_{2I}B_{12Q} - M_{2Q}B_{12I} + \\ M_{3I}B_{13Q} - M_{3Q}B_{13I} + \\ M_{4I}B_{14Q} - M_{4Q}B_{14I}$$

To complete the function of digital transform matrix 116, 4 complex multiplier circuits 124 are required for a 4×4 transform matrix. Other complex multiplier circuits 138, 140, and 142 produce complex signals $A_2$, $A_3$, and $A_4$, respectively. Each signal $A_x$ is then coupled to an amplifier in amplifier array 104. Digital transform matrix 116 may be implemented in an application specific integrated circuit (ASIC) having registers for receiving the matrix transform coefficients.

Figure 9:
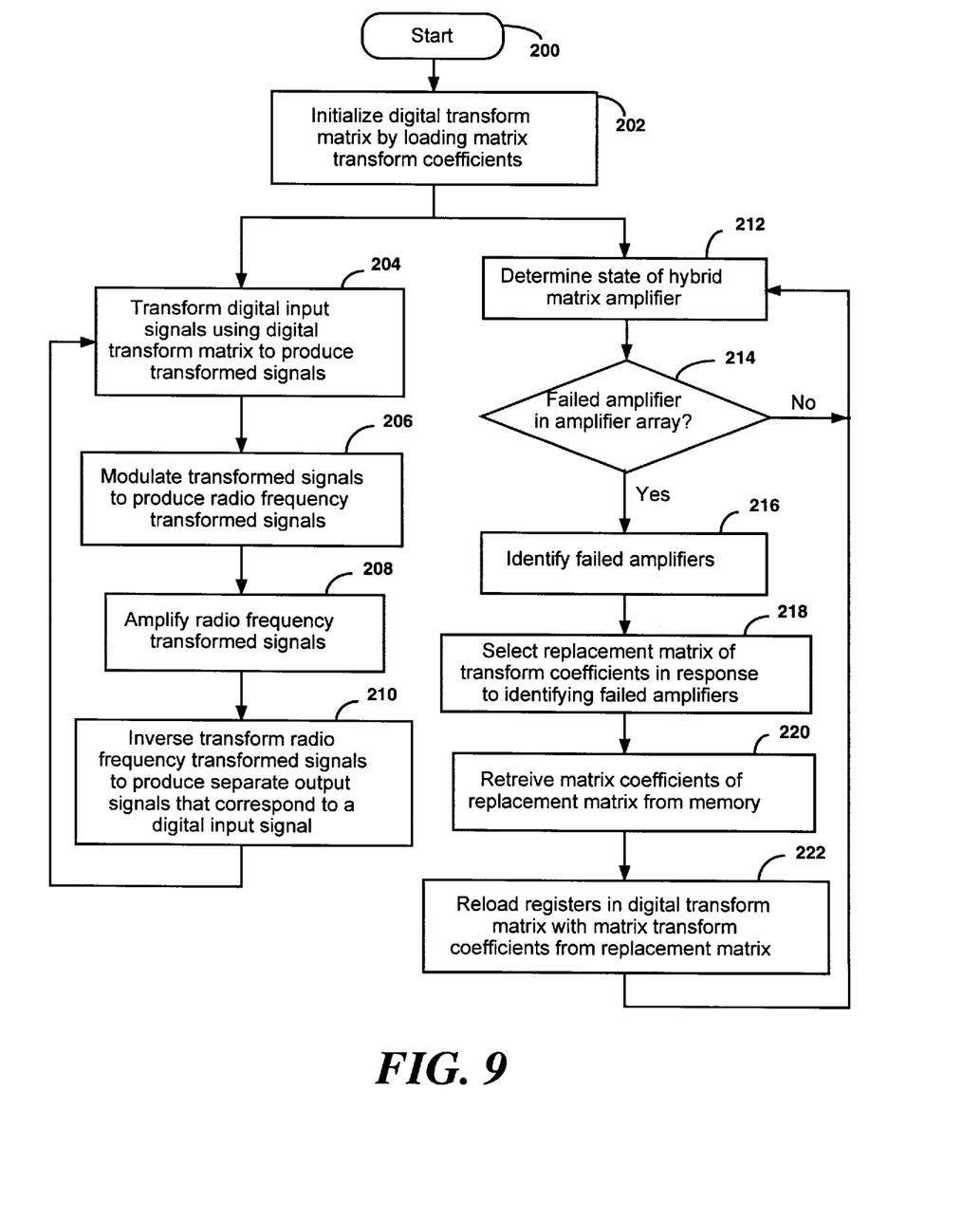
FIG. 9 is a high-level logic flowchart which illustrates the operation of the method and system of the present invention.

With reference now to FIG. 9, there is depicted a high-level logical flowchart which illustrates the method and system of the present invention. As illustrated, the process starts at block 200 and thereafter passes to block 202, wherein the digital transform matrix is initialized by loading registers in the digital transform matrix with a full complement of matrix transform coefficients for operating in a normal mode. These matrix transform coefficients may be recalled from memory 130 and written into registers 118 by controller 128, as shown in FIG. 6. The matrix of transform coefficients for normal operation is shown below in Matrix 1. Normal operation implies that all signal paths from inputs $M_1$ through $M_4$ to hybrid matrix amplifier outputs 132 are in working order. For example, in some embodiments, ampli- Thereafter, the present invention operates concurrently along two separate paths: one path describes a transform, amplify, and inverse transform signal processing loop, while the other path describes a loop that monitors the health of the hybrid matrix amplifier, and in response to an error condition, reconfigures the transform operation of the digital transform matrix to compensate for the failure mode.

As illustrated at block 204, digital input signals, such as $M_1$ through $M_4$, are transformed using digital signal transform matrix 116 to produce transformed signals, such as signals $A_1$ through $A_4$. Thereafter, transformed signals $A_1$ through $A_4$ are modulated to produce radio frequency transformed signals, as illustrated at block 206.

After modulating the transformed signals, the radio frequency transformed signals are amplified, as depicted at block 208. An amplifier array, such as amplifier array 104, may be used to amplify the radio frequency transformed signals.

Finally, an inverse transform operation is performed on the amplified radio frequency transformed signals to produce separate output signals that correspond to one of the digital input signals $M_1$ through $M_4$, as illustrated at block 210.

As mentioned above, blocks 204 through 210 describe signal amplification within a hybrid matrix amplifier. In parallel with this operation, the process determines the state of the hybrid matrix amplifier, as depicted at block 212. The state of the hybrid matrix amplifier may, for example, include a degraded state wherein one or more of the amplifiers in amplifier array 104 has failed. The state of the hybrid matrix amplifier may alternatively indicate that a user is requesting the amplifier to operate in a different mode, such as mode that supports a 6-sector cell site rather than a 3-sector cell site.

Next, in the example shown, the process determines whether an amplifier in the amplifier array has failed, as illustrated at block 214. It should be recognized that block 214 may also be used to detect states of hybrid matrix amplifier other than a degraded state wherein an amplifier in the amplifier array has failed. If the process determines that an amplifier has not failed, the process iteratively returns to block 212 to continue to monitor the state of the hybrid matrix amplifier.

If, however, the process detects a failed amplifier, the process then identifies the particular failed amplifier, as depicted at block 216. In response to identifying the particular amplifier that has failed, the process then selects a replacement matrix of transform coefficients, as illustrated at block 218. Matrix 2 below shows a replacement matrix that may be used if the first amplifier in the amplifier array fails. Matrix 3 shows a replacement matrix of transform coefficients that may be loaded into digital transform matrix 116 if a second amplifier in amplifier array 104 fails. Matrix 4 shows a matrix of transform coefficient that may be used if a third amplifier in amplifier array 104 fails. And finally, Matrix 5 shows a replacement matrix of transform coefficients that may be used to reconfigure digital matrix transform matrix 116 if a fourth amplifier in amplifier array 104 fails. Each replacement matrix has been selected to maximize signal isolation at hybrid matrix amplifier outputs 132 in view of the particular amplifier that has failed.

retrieved from memory, as depicted at block 220. Thereafter, the process reloads the registers in the digital transform matrix with the matrix of transform coefficients recalled from memory, as illustrated at block 222. This concludes the process of reconfiguring digital transform matrix 116 in Matrix 2

$$\begin{bmatrix} 0 & 0 & 0 & 0 \\ 2.966125E-02+j.6833946 & .6603469-j.1784609 & -.1278111+j.1295191 & 0 \\ .1495217+j.4776695 & 1.984147E-03+j.5005064 & .684023-j4.460727E-03 & 0 \\ .1075738-j.4887961 & .2504059+j.4333635 & 4.462317E-03+j.68402170 & 0 \end{bmatrix}$$

Matrix 3

$$\begin{bmatrix} -.6834287-j2.883536E-02 & 1.380069E-02+j.6838975 & .1341593+j.1229523 & 0 \\ 0 & 0 & 0 & 0 \\ .4478536+j.1490349 & -.4807528+j.1383495 & .6833617-j3.011619E-02 & 0 \\ .4886708-j.1080837 & .4864195+j.1189444 & .0301195+j.6833808 & 0 \end{bmatrix}$$

Matrix 4

$$\begin{bmatrix} -.476566+j.1528133 & -.2426451+j.4376298 & .5083497+j.4578379 & 0 \\ -.3376994+j.3694676 & .4282318-j.2593597 & -.4577393+j.5082725 & 0 \\ 0 & 0 & 0 & 0 \\ .575801-j.3692665 & .4929148+j.4743422 & 9.50376E-03+j.1817075 & 0 \end{bmatrix}$$

Matrix 5

$$\begin{bmatrix} -.4818861-j.1348983 & .2738014+j.4191281 & .5089527+j.4570488 & 0 \\ .3512893+j.3566404 & .4456675+j.2276047 & -.4570306+j.5089419 & 0 \\ .5891334+j.3476041 & -.4572723+j.5087439 & .1817044-j9.747811E-03 & 0 \\ 0 & 0 & 0 & 0 \end{bmatrix}$$

The matrix transform coefficients shown in Matrix 2–5 have been calculated by an iterative process wherein $M_1$ is set to a data streams of 1s and $M_2$–$M_4$ are set equal to 0. Matrix transform coefficients in registers 118 are adjusted until the power at a hybrid matrix amplifier 132 corresponding to message $M_1$ is close to 1, assuming that the gain of amplifier array is normalized to unity gain, while outputs 132 corresponding to $M_2$–$M_4$ are minimized to 0. After this set, an initial set of matrix transform coefficients has been determined.

Message $M_2$ is set to 1 while all other inputs are set to 0 and outputs 132 are measured with the same set of matrix transform coefficients. Similarly, message $M_3$ is set to 1 while all others are set to 0 and message $M_4$ is set to 1 while all others are set to 0 and outputs are measured each time. Thus, after cycling through message inputs $M_2$–$M_4$ four sets of output measurements have been taken. These four sets of output measurements are then combined to generate a score generating the effectiveness of the transform coefficients.

Thereafter, each individual transform coefficient is varied and a new score is determined and compared against the previous score. If the score improves the iteration continues to adjust the first transform coefficient until a minimum score has been found. Next, the second matrix transform coefficient is adjusted in an attempt to lower the score even further. After all transform coefficients have been adjusted, in an attempt to lower the score of hybrid matrix amplifier outputs 132, the process then returns to the first matrix transform coefficients and makes further adjustments in yet another attempt to lower the score of the hybrid matrix amplifier outputs. This process continues until the score has been minimized.

After the selection of the replacement matrix, the matrix transform coefficients of the replacement matrix are response to a change of state that was detected at block 214. After reconfiguring digital transform matrix 116, the process iteratively returns to block 212, wherein the process continues to monitor the state of the amplifier.

The foregoing description of a preferred embodiment of the invention has been presented for the purpose of illustration and description. It is not intended to be exhaustive or to limit the invention to the precise form disclosed. Modifications or variations are possible in light of the above teachings. The embodiment was chosen and described to provide the best illustration of the principles of the invention and its practical application, and to enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally, and equitably entitled.

What is claimed is:

1. A hybrid matrix amplifier comprising:
    a configurable digital transformer having inputs coupled to first and second digital signals, wherein said configurable digital transformer is adapted to operate in a plurality of transform modes that process said first and second digital signals to produce first and second transformed signals;
    an amplifier array having inputs coupled to said first and second transformed signals and outputs for providing first and second amplified transformed signals;
    an inverse transform matrix having inputs coupled to said first and second amplified transformed signals and outputs for producing at least one output signal;

a state sensor coupled to said amplifier array to produce an amplifier state signal that represents a state of said hybrid matrix amplifier; and a controller coupled to said state sensor and said configurable digital transformer to provide reconfiguration signals to said configurable digital transformer in response to said amplifier state signal.

2. The hybrid matrix amplifier according to claim 1 wherein said configurable digital transformer further includes registers for storing transform parameters used by different ones of said plurality of transform modes to control characteristics of said first and second transformed signals.

3. The hybrid matrix amplifier according to claim 2 wherein said characteristics of said first and second transformed signals include signal phase and signal amplitude.

4. The hybrid matrix amplifier according to claim 1 wherein said amplifier array includes a plurality of amplifiers, and wherein said state of said hybrid matrix amplifier includes a degraded state occurring in response to at least one amplifier in said amplifier array failing.

5. The hybrid matrix amplifier according to claim 1 further including a memory coupled to said controller to store matrix transform coefficients, wherein said reconfiguration signals include selected matrix transform coefficients used to reconfigure said configurable digital transformer in response to said amplifier state signal.

6. The hybrid matrix amplifier according to claim 5 wherein said matrix transform coefficients include matrix transform coefficients selected to maximize signal isolation at said at least one output signal.

7. The hybrid matrix amplifier according to claim 6 wherein said matrix transform coefficients selected to maximize signal isolation at said at least one output signal include matrix transform coefficients selected to maximize signal isolation at said at least one output signal when said amplifier state signal indicates said degraded state.

8. A method for amplifying a plurality of digital input signals in a hybrid matrix amplifier, said method comprising the steps of:

initializing a configurable digital transform matrix with a matrix of transform coefficients;

receiving a plurality of digital input signals at inputs of said configurable digital transform matrix;

transforming said plurality of digital input signals using said matrix of transform coefficients in said configurable digital transform matrix to produce a plurality of transformed digital signals;

converting said plurality of transformed digital signals to a plurality of transformed analog signals;

amplifying said plurality of transformed analog signals using an amplifier array to produce amplified transformed signals;

inverse transforming said amplified transformed signals to produce output signals that correspond to said plurality of digital input signals;

detecting a degraded state of said amplifier array; and in response to detecting said degraded state, reloading said configurable digital transform matrix with a matrix of transform coefficients selected to minimize output signal degradation.

9. The method for amplifying a plurality of digital input signals in a hybrid matrix amplifier according to claim 8 wherein said configurable digital transform matrix includes registers for storing transform parameters that control characteristics of said plurality of transformed digital signals, and wherein said step of initializing a configurable digital transform matrix with a matrix of transform coefficients includes loading a matrix of transform coefficients into said registers and wherein said step of reloading into said registers said configurable digital transform matrix includes loading a matrix of transform coefficients selected to minimize output signal degradation.

10. The method for amplifying a plurality of digital input signals in a hybrid matrix amplifier according to claim 9 wherein said step of transforming said plurality of digital input signals using said matrix of transform coefficients in said configurable digital transform matrix further includes transforming said plurality of digital input signals using a matrix of transform coefficients that performs a Fourier transformation.

11. The method for amplifying a plurality of digital input signals in a hybrid matrix amplifier according to claim 10 wherein said step of inverse transforming said amplified transformed signals to produce output signals that correspond to said plurality of digital input signals further includes performing an inverse Fourier transform to produce output signals that correspond to said plurality of digital input signals.

12. The method for amplifying a plurality of digital input signals in a hybrid matrix amplifier according to claim 8 wherein said step of converting said plurality of transformed digital signals to a plurality of transformed analog signals includes converting said plurality of transformed digital signals to a plurality of transformed modulated radio frequency analog signals.

13. The method for amplifying a plurality of digital input signals in a hybrid matrix amplifier according to claim 8 wherein said degraded state of said amplifier array is an amplifier failure.

14. The method for amplifying a plurality of digital input signals in a hybrid matrix amplifier according to claim 8 wherein said matrix of transform coefficients selected to minimize output signal degradation is a matrix of transform coefficients selected to maximize output signal separation.

15. A system for amplifying a plurality of digital input signals in a hybrid matrix amplifier comprising:

means for initializing a configurable digital transform matrix with a matrix of transform coefficients;

means for receiving a plurality of digital input signals at inputs of said configurable digital transform matrix;

means for transforming said plurality of digital input signal using said matrix of transform coefficients in said configurable digital transform matrix to produce a plurality of transformed digital signals;

means for converting said plurality of transformed digital signals to a plurality of transformed analog signals;

means for amplifying said plurality of transformed analog signals using an amplifier array to produce amplified transformed signals;

means for inverse transforming said amplified transformed signals to produce output signals that correspond to said plurality of digital input signals;

means for detecting a degraded state of said amplifier array; and means for reloading said configurable digital transform matrix with a matrix of transform coefficients selected to minimize output signal degradation in response to detecting said degraded state.

16. The system for amplifying a plurality of digital input signals in a hybrid matrix amplifier according to claim 15 wherein said configurable digital transform matrix includes registers for storing transform parameters that control characteristics of said plurality of transformed digital signals, and wherein said means for initializing a configurable digital transform matrix with a matrix of transform coefficients includes means for loading a matrix of transform coefficients into said registers, and wherein said means for reloading into said registers said configurable digital transform matrix includes mean for loading a matrix of transform coefficients selected to minimize output signal degradation.

17. The system for amplifying a plurality of digital input signals in a hybrid matrix amplifier according to claim 16 wherein said means for transforming said plurality of digital input signals using said matrix of transform coefficients in said configurable digital transform matrix further includes means for transforming said plurality of digital input signals using a matrix of transform coefficients that performs a Fourier transformation.

18. The system for amplifying a plurality of digital input signals in a hybrid matrix amplifier according to claim 17 wherein said means for inverse transforming said amplified transformed signals to produce output signals that correspond to said plurality of digital input signals further includes means for performing an inverse Fourier transform to produce output signals that correspond to said plurality of digital input signals.

19. The system for amplifying a plurality of digital input signals in a hybrid matrix amplifier according to claim 15 wherein said means for converting said plurality of transformed digital signals to a plurality of transformed analog signals includes means for converting said plurality of transformed digital signals to a plurality of transformed modulated radio frequency analog signals.

20. The system for amplifying a plurality of digital input signals in a hybrid matrix amplifier according to claim 15 wherein said degraded state of said amplifier array is an amplifier failure.

21. The system for amplifying a plurality of digital input signals in a hybrid matrix amplifier according to claim 15 wherein said matrix of transform coefficients selected to minimize output signal degradation is a matrix of transform coefficients selected to maximize output signal separation.

* * * * *

UNITED STATES PATENT AND TRADEMARK OFFICE
CERTIFICATE OF CORRECTION

PATENT NO : 5,834,972
DATED : November 10, 1998
INVENTOR(S): Schiemenz, Jr. et al.

It is certified that error appears in the above-identified patent and that said Letters Patent are hereby corrected as shown below:

In Column 10, line 46 Please replace the word "signal" with the corrected word "signals".

In Column 11, line 7 Please replace the word "mean" with the corrected word "means".

Signed and Sealed this

Seventeenth Day of April, 2001

Attest:

NICHOLAS P. GODICI

Attesting Officer

Acting Director of the United States Patent and Trademark Office